US012736578B2

(12) United States Patent
Vulli et al.

(10) Patent No.: US 12,736,578 B2
(45) Date of Patent: Sep. 15, 2026

(54) DIAGNOSIS AND PROGNOSIS OF IGBT MODULES

(71) Applicant: ABB Schweiz AG, Baden (CH)

(72) Inventors: Aleksi Vulli, Helsinki (FI); Gerd Schlottig, Uitikon Waldegg (CH); Enea Bianda, Baden (CH); Michal Orkisz, Cracow (PL); Marcin Firla, Cracow (PL)

(73) Assignee: ABB SCHWEIZ AG, Baden (CH)

( * ) Notice: Subject to any disclaimer, the term of this patent is extended or adjusted under 35 U.S.C. 154(b) by 424 days.

(21) Appl. No.: 18/465,207

(22) Filed: Sep. 12, 2023

(65) Prior Publication Data

US 2024/0118333 A1 Apr. 11, 2024

(30) Foreign Application Priority Data

Sep. 15, 2022 (EP) .................................... 22195844

(51) Int. Cl.

*G01R 31/26* (2020.01)
*G01R 31/27* (2006.01)

(52) U.S. Cl.

CPC ......... *G01R 31/2619* (2013.01); *G01R 31/27* (2013.01)

(58) Field of Classification Search

CPC ............ G01R 31/2619; G01R 31/2846; G01R 31/2817; G01R 31/2812; G01R 31/27; H02P 29/68; G01K 7/01

See application file for complete search history.

(56) References Cited

U.S. PATENT DOCUMENTS 9,039,279 B2 * 5/2015 Sundaramoorthy ......................... G01R 31/2619 374/170
9,748,947 B1 * 8/2017 Wagoner ............. H03K 17/168
10,393,795 B2 * 8/2019 Aeloiza ............. G01R 31/2817

FOREIGN PATENT DOCUMENTS

EP 2615467 A1 7/2013
JP 2020162241 A 10/2020

OTHER PUBLICATIONS

European Search Report; Application No. 22195844.0; Completed: Mar. 3, 2023; 3 Pages.

* cited by examiner

*Primary Examiner* — An H Do
(74) *Attorney, Agent, or Firm* — Greenberg Traurig, LLP

(57) ABSTRACT

An apparatus for performing the following. The apparatus maintains, in a memory, information on a computational model for thermal behavior of layers of an insulated-gate bipolar transistor, IGBT, module. The apparatus obtains measurements of the dissipated power at the semiconductors and the ambient temperature and determines one or more current values of one or more temperatures of the IGBT module based on a switching delay of the IGBT module. The apparatus calculates a current estimate of a joint state-parameter space of the computational model using a Bayesian filter and the computational model taking as inputs the dissipated power and the ambient temperature. The joint state-parameter space includes the one or more temperatures, one or more thermal loss parameters and one or more wear parameters. The one or more current values of the one or more temperatures are used as observations in the Bayesian filter.

13 Claims, 7 Drawing Sheets

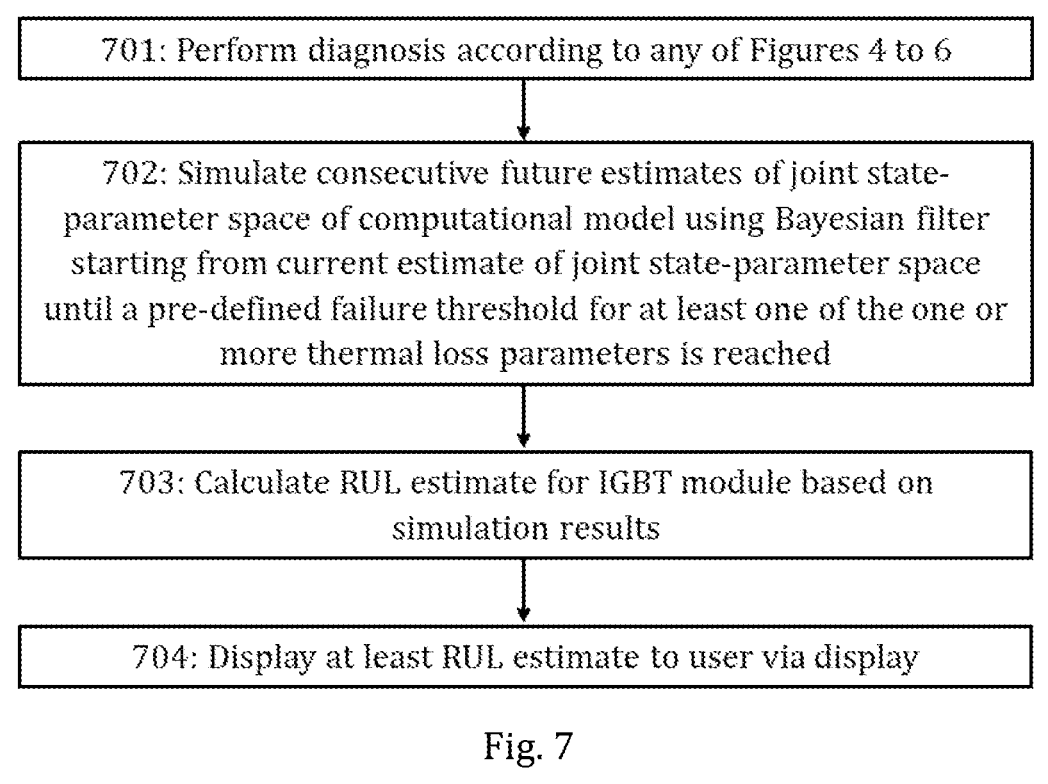

701: Perform diagnosis according to any of Figures 4 to 6

702: Simulate consecutive future estimates of joint state-parameter space of computational model using Bayesian filter starting from current estimate of joint state-parameter space until a pre-defined failure threshold for at least one of the one or more thermal loss parameters is reached 703: Calculate RUL estimate for IGBT module based on simulation results 704: Display at least RUL estimate to user via display

Fig. 7

DIAGNOSIS AND PROGNOSIS OF IGBT MODULES

TECHNICAL FIELD

Various example embodiments relate to diagnostics and prognostics of electrical components for high-power applications.

BACKGROUND

Insulated-gate bipolar transistors (IGBTs) are three-terminal power semiconductor devices usable as an electronic switch especially in high-power applications. IGBT (power) module are assemblies which comprise one or more IGBTs in one package. IGBT modules are commonly used, for example, in (motor) drives. While IGBT modules have proven to be an efficient and dependable solution for switching in high-power applications, they will, nevertheless, eventually when in continuous use stop working in an optimal manner due to, e.g., temperature cycling during the use of the IGBT module causing damage to the solder layers. Therefore, the health of the IGBT module should be monitored continuously or regularly to avoid breakage. Conventional solutions for IGBT module prognostics are based on cycle counting and manufacturer-provided lifetime models. Typically, such techniques lack feedback information regarding the health of the IGBT module. Additionally, the lifetime models are statistical population models, and might thus not describe each unit accurately enough.

SUMMARY

According to an aspect, there is provided the subject matter of the independent claims. Embodiments are defined in the dependent claims.

One or more examples of implementations are set forth in more detail in the accompanying drawings and the description below. Other features will be apparent from the description and drawings, and from the claims.

Some embodiments provide an apparatus, a method, and computer readable media for diagnosis (and prognosis) of an IGBT module. A further embodiment provides a drive comprising said apparatus and said IGBT module.

BRIEF DESCRIPTION OF DRAWINGS

In the following, example embodiments will be described in greater detail with reference to the attached drawings, in which

FIG. 7 illustrates an exemplary process according to embodiments for performing diagnosis and prognosis for an IGBT module.

DETAILED DESCRIPTION OF SOME EMBODIMENTS

Figure 1:
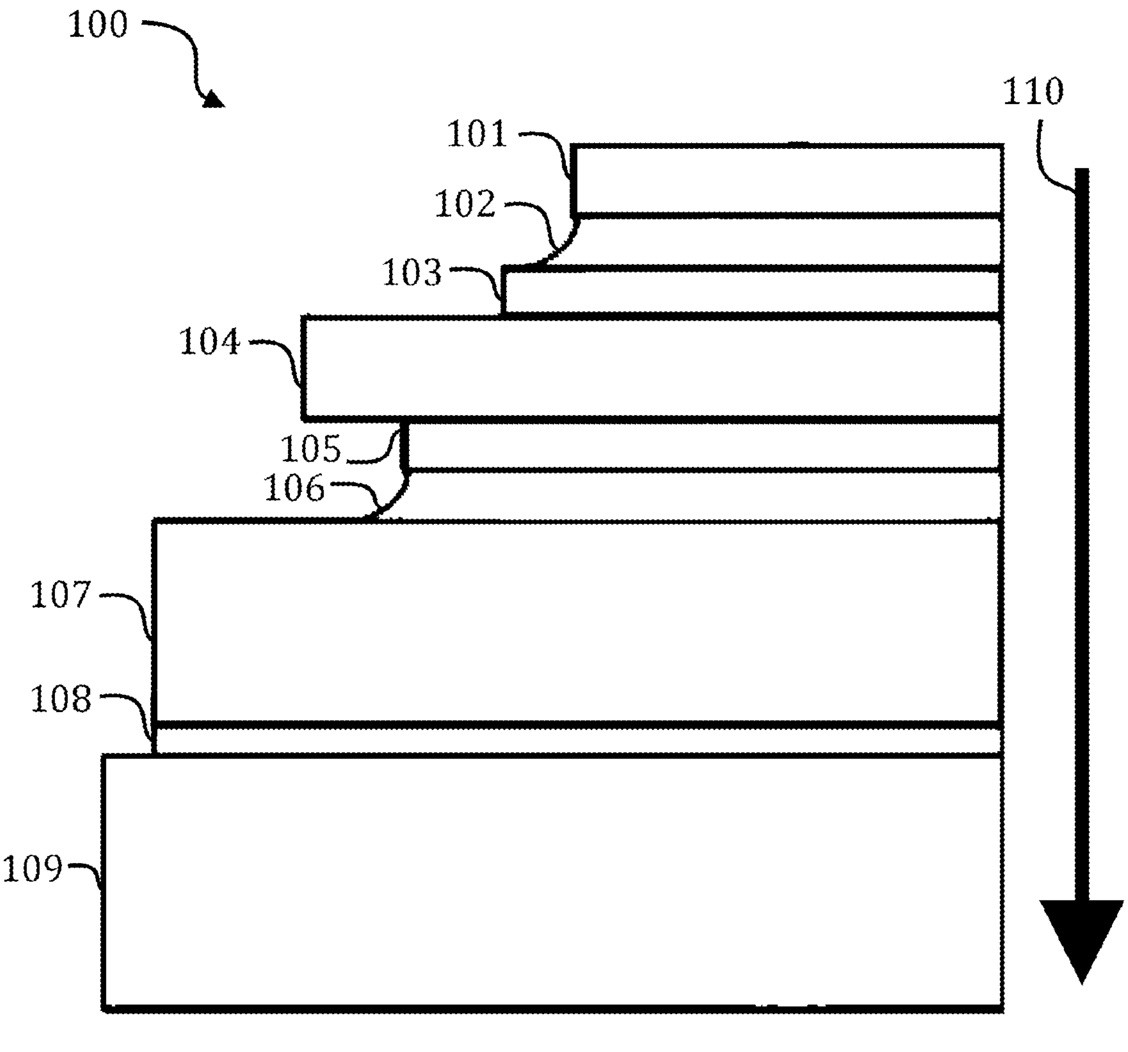
FIG. 1 illustrates an exemplary IGBT module associated with embodiments.

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

As used in this application, the term 'circuitry' may refer to one or more or all of the following: (a) hardware-only circuit implementations, such as implementations in only analog and/or digital circuitry, and (b) combinations of hardware circuits and software (and/or firmware), such as (as applicable): (i) a combination of analog and/or digital hardware circuit(s) with software/firmware and (ii) any portions of hardware processor(s) with software, including digital signal processor(s), software, and memory(ies) that work together to cause an apparatus, such as a terminal device or an access node, to perform various functions, and (c) hardware circuit(s) and processor(s), such as a microprocessor(s) or a portion of a microprocessor(s), that requires software (e.g. firmware) for operation, but the software may not be present when it is not needed for operation. This definition of 'circuitry' applies to all uses of this term in this application, including any claims. As a further example, as used in this application, the term 'circuitry' also covers an implementation of merely a hardware circuit or processor (or multiple processors) or a portion of a hardware circuit or processor and its (or their) accompanying software and/or firmware.

In the following, the following definitions may apply. A chip solder layer is a solder layer connecting a silicon chip layer of an IGBT module to a (top) metallic layer of the IGBT module. A system solder layer (equally called a baseplate solder layer) is a solder layer connecting a baseplate of an IGBT module to a (bottom) metallic layer of the IGBT module.

Insulated-gate bipolar transistors (IGBTs) are three-terminal power semiconductor devices which are commonly used as electronic switches especially in high-power applications. IGBT (power) module are assemblies which comprise one or more IGBTs in one package. IGBTs and IGBT modules are commonly used, for example, in inverter applications relating, for example, to (motor) drives or frequency converters.

While IGBT modules have proven to be an efficient and dependable solution for switching in high-power applications, they will, nevertheless, eventually when in continuous use stop working in an optimal manner due to, e.g., temperature cycling during the use of the IGBT module causing damage to the solder layers (i.e., solder area loss). Specifically, temperature cycling during the use of the IGBT module causes delamination of solder layers below the chip and/or between the substrate and the baseplate of the IGBT module leading to increase of the chip temperature and finally bond wire lift off and temperature runaway. Therefore, the health of the IGBT module should be monitored continuously or regularly to avoid breakage. Conventional solutions for IGBT module prognostics are based on cycle counting and manufacturer-provided lifetime models. Typically, such techniques lack feedback information regarding the health of the IGBT module. Ideally, the RUL prediction of the IGBT module would be improved the closer to failure the IGBT module gets though such operation is not possible without said feedback information. In simple terms, the (transistor) junction temperature $T_j$ and case temperature $T_c$ cycles are conventionally calculated using a Rainflow (or Rainflow-counting) algorithm, and the effect of each cycle is subtracted from the total life of the IGBT module using population-level lifetime models. Here, $T_j$ and $T_c$ are typically estimated based on the negative temperature coefficient (NTC) temperature the IGBT module, the DC-link voltage and the phase current. According to current knowledge, neither of these measurements depends on damage incurred by the IGBT module. In other words, in case of damage to the IGBT module, the estimated $T_j$ and $T_c$ do not change even though the actual $T_j$ and $T_c$ do. Consequently, conventional solutions for RUL prediction cannot be made to improve when the IGBT module approaches failure. Additionally, the conventional lifetime models are statistical population models, and are, thus, limited in terms of accuracy.

The embodiments to be discussed below seek to overcome at least some of the problems discussed above. The embodiments involve measurements of the actual damage-dependent junction temperature $T_j$ based on IGBT switching delays and using said measurements for evaluating the current health of the IGBT module and optionally for predicting the RUL in an accurate manner. At least some of the embodiments are also further based on unit-specific damage models comprising unknown wear parameters, which govern the unit-specific damage progression rate and which may be determined using a Bayesian filter (e.g., a particle filter). The embodiments enable estimation of these parameters during online usage of the IGBT module, thus enabling individual diagnosis and optionally also prognosis.

To facilitate the detailed discussion of embodiments involving diagnosis (and prognosis) of IGBT modules, the basic structure of an exemplary IGBT module 100 is discussed in the following in connection with FIG. 1. FIG. 1 illustrates a side-view of a plurality of layers 101 to 109 forming an IGBT module 100. The arrow 110 indicates the direction of heat flow in the IGBT module.

Referring to FIG. 1, the IGBT module 100 comprises the following layers (from top to bottom):

- a silicon chip layer 101 comprising one or more IGBTs,
- a chip solder layer 102,
- a first metallic layer 103,
- a ceramic insulator layer 104 (equally called simply a substrate),
- a second metallic layer 105,
- a system solder layer, 106 (equally called a baseplate solder layer),
- a baseplate 107,
- a thermal interface material (TIM) layer 108 and
- a heatsink 109.

The silicon chip layer 101 (being the top layer) comprises one or more IGBTs of the IGBT module 100.

The chip solder layer 102 connecting the silicon chip layer 101 to the first metallic layer 103 and the system solder layer 106 connecting the second metallic layer 105 to the baseplate 107 may be made of any conventional solder material such as SnAgCu. Temperature cycling during the use of the IGBT module causes damage especially to the solder layers 102, 105. The damage manifests in lost contact area of the solder layers 102, 104 affecting how the solder layers 102, 104 transfer and store thermal energy. In some embodiments, a different type of joining layer may be employed instead of the chip and/or system solder layer such as a chip and/or system sintering layer.

The first and second metallic layers 103, 105 may be, for example, copper layers. The ceramic insulator layer 104 may be, for example, made of alumina ($Al_2O_3$) or aluminum nitride (AlN). The first and second metallic layers 103, 105 may form with the ceramic insulator layer 104 a direct bond copper (DBC) layer or substrate. The first and second metallic layers 103, 105 may be equally called first and second metal traces.

The baseplate 107 may be made of a metal or an alloy. For example, the baseplate 107 may be made of aluminum or copper.

The TIM layer 108 may be made of any conventional TIM material used in power electronics. A TIM may, in general, be defined to be any substance which, when placed between two components, serves to improve the transfer of heat from one component to the other.

The heatsink 109 may be made of any metal (e.g., copper or aluminum) or alloy (e.g., aluminum alloy).

In some embodiments, the IGBT module under analysis may only comprise a subset of the layers illustrated in FIG. 1. Additionally or alternatively, the IGBT module under analysis may comprise one or more further layer not illustrated in FIG. 1.

Figure 2:
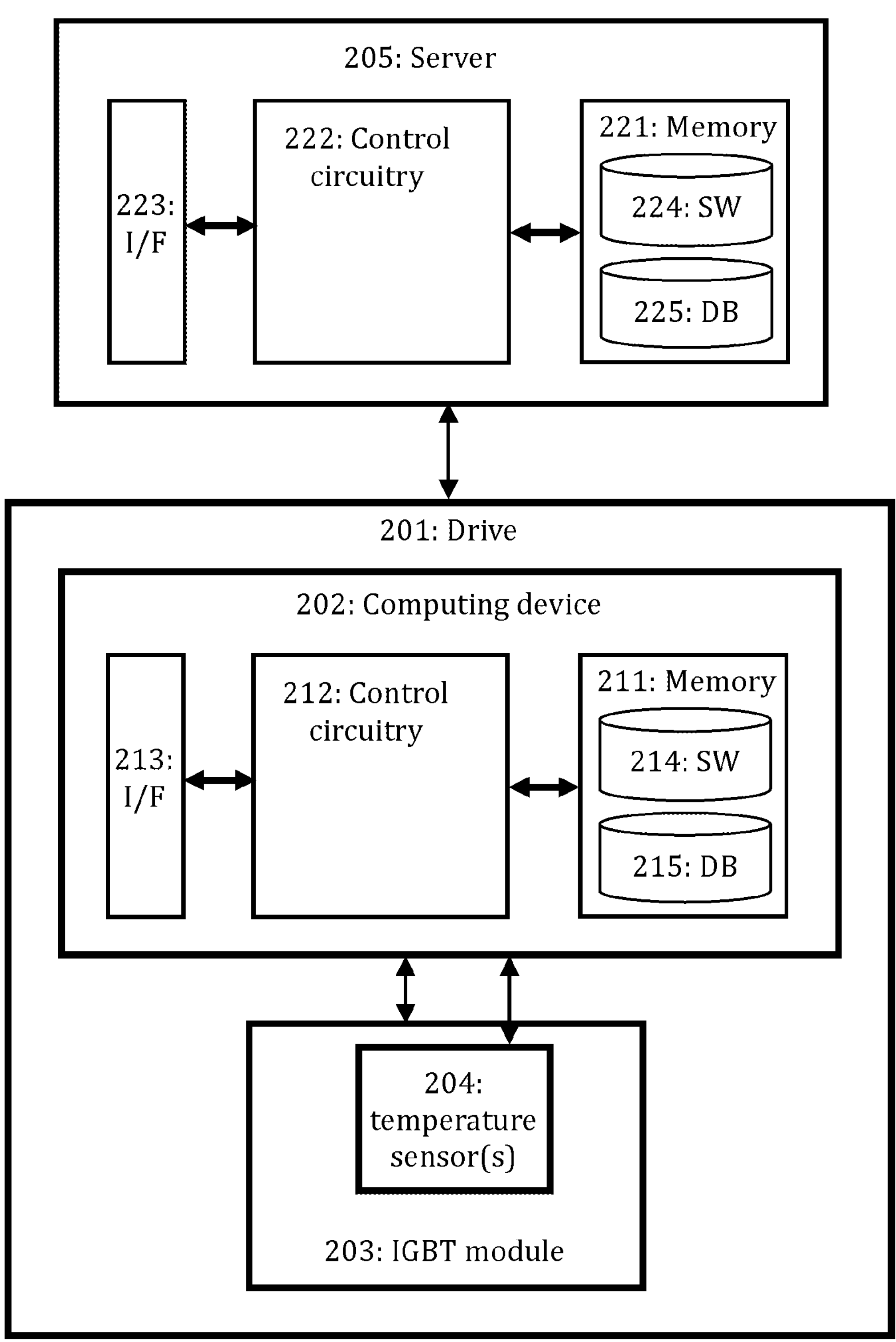
FIG. 2 illustrates an exemplary system according to embodiments.

FIG. 2 illustrates a system according to embodiments. The system of FIG. 2 comprises a drive 201 (or a frequency converter) for driving an electrical machine or a motor. The drive 201 comprises a computing device 202 and at least one IGBT module 203 (only a single IGBT module 203 is shown in FIG. 2 merely for simplicity of presentation) and a server 205 communicatively connected to the drive 201 (or at least to the computing device 202). In some embodiments, the computing device 202 and/or said at least one IGBT module 203 may comprised specifically in an inverter module of the drive or frequency converter 201.

The IGBT module 203 may correspond, for example, to the IGBT module 100 as discussed in connection with FIG. 1. Additionally, the IGBT module 203 may be equipped with one or more (layer-specific) temperature sensors 204 where each of the one or more temperature sensors 204 may be configured and/or arranged to measure temperature associated with a layer or multiple adjacent layers of the IGBT module 203. The one or more temperature sensors 204 may comprise at least a temperature sensor (e.g., an IGBT NTC sensor) for measuring a temperature at the top metallization of the DBC substrate (i.e., a temperature of the first metallic layer 103 in the case of the IGBT module 100 of FIG. 1) and/or a temperature sensor for measuring a temperature of the heatsink of the IGBT module (i.e., a temperature of the heatsink 109 in the case of the IGBT module 100 of FIG. 1).

The computing device 202 may be configured at least to carry out diagnosis and optionally also prognosis regarding the health of the IGBT module 203, as will be described below in detail. The computing device 202 comprises a processor 212, interfaces (I/F) 213 and a memory 211. The processor 212 may be a central processing unit (CPU) of the computing device 202 and/or the drive 201. In some embodiments, one or more control circuitry such as one or more processors may be provided in the computing device 202, instead of a singular processor 212. According to embodiments, the computing device 202 may comprise one or more control circuitry 212, such as at least one processor, and at least one memory 211, including one or more algorithms 214, such as a computer program code (software), wherein the at least one memory and the computer program code (software) are configured, with the at least one processor, to cause the computing device to carry out any one of the exemplified functionalities of the computing device to be described below. It is also feasible to use specific integrated circuits, such as ASIC (Application Specific Integrated Circuit) or other components and devices for implementing the functionalities in accordance with different embodiments.

The memory 211 of the computing device 202 may be implemented using any suitable data storage technology, such as semiconductor based memory devices, flash memory, magnetic memory devices and systems, optical memory devices and systems, fixed memory and removable memory. The memory 211 comprises at least one database (DB) 215 and software (SW) 214 (i.e., one or more algorithms).

The interfaces 213 of the computing device 202 may comprise, for example, one or more communication interfaces comprising hardware and/or software for realizing communication connectivity according to one or more communication protocols. Specifically, the one or more communication interfaces 213 may comprise, for example, at least one interface providing a connection to the IGBT module 203 (at least for evaluating a switching delay associated with the IGBT module 203) and/or to the one or more temperature sensors and/or to the server 205. The one or more communication interfaces 213 may enable a connection to the Internet. The one or more communication interfaces 213 may comprise standard well-known components such as an amplifier, filter, frequency-converter, (de)modulator, and encoder/decoder circuitries, controlled by the corresponding controlling units, and one or more antennas. The one or more communication interfaces 213 may also comprise a user interface.

The drive 201 and the server 205 may be connected via a communications network enabling communication between the drive 201 and the server 205. The communications network may comprise one or more wireless networks and/or one or more wired networks. Said one or more wireless networks may be based on any mobile system, such as GSM, GPRS, LTE, 4G, 5G, 6G and beyond, and a wireless local or personal area network, such as Wi-Fi or Bluetooth. The communications network may comprise the Internet. In some embodiments, the communications network may be replaced with a wired or wireless communication link.

The server 205 may be configured to perform diagnosis and prognosis (or at least prognosis) regarding the health of the IGBT module 203 based on information received from the computing device 202. For example, the computing device 202 may be configured to perform real-time analysis (e.g., diagnosis) while the server 205 may be configured to perform more computationally demanding operations (e.g., prognosis) based on the diagnosis results received from the computing device 202.

The connection between the drive 201 and the server 205 may be provided via at least one wireless and/or wired communication link and/or at least one wireless and/or wired communication network. The at least one wireless and/or wired network may be based on any mobile system, such as GSM, GPRS, LTE, 4G, 5G, 6G and beyond, and a wireless local or personal area network, such as Wi-Fi or Bluetooth. The at least one wireless and/or wired network may comprise the Internet. In general, the server 205 may be a local or remote device relative to the drive 201. In some embodiments, the server 205 may be a cloud-based server.

The server 205 comprises a processor 222, interfaces (I/F) 223 and a memory 221. The processor 222 may be a central processing unit (CPU) of the server 205. In some embodiments, one or more control circuitry such as one or more processors may be provided in the server 205, instead of a singular processor 222.

According to embodiments, the server 205 may comprise one or more control circuitry 222, such as at least one processor, and at least one memory 211, including one or more algorithms 224, such as a computer program code (software), wherein the at least one memory and the computer program code (software) are configured, with the at least one processor, to cause the server to carry out any one of the exemplified functionalities of the server to be described below. It is also feasible to use specific integrated circuits, such as ASIC (Application Specific Integrated Circuit) or other components and devices for implementing the functionalities in accordance with different embodiments.

The memory 221 of the server 205 may be implemented using any suitable data storage technology, such as semiconductor based memory devices, flash memory, magnetic memory devices and systems, optical memory devices and systems, fixed memory and removable memory. The memory 221 comprises at least one database (DB) 225 and software (SW) 224 (i.e., one or more algorithms).

The interfaces 223 of the server 205 may comprise, for example, one or more communication interfaces comprising hardware and/or software for realizing communication connectivity according to one or more communication protocols. Specifically, the one or more communication interfaces 223 may comprise, for example, at least one interface providing a connection to the server 205. The one or more communication interfaces 223 may enable a connection to the Internet. The one or more communication interfaces 223 may comprise standard well-known components such as an amplifier, filter, frequency-converter, (de)modulator, and encoder/decoder circuitries, controlled by the corresponding controlling units, and one or more antennas. The one or more communication interfaces 223 may also comprise a user interface.

In some embodiments, no server 205 may be connected to the computing device 202. In such embodiments, the diagnosis and/or prognosis may be performed fully by the computing device 202 of the drive 201.

At least some of the embodiments are based on defining the layer structure of the IGBT module (such as the one shown in FIG. 1) using the Cauer thermal model. The Cauer thermal model models heat transfer through multiple layers of a semiconductor module using a thermal equivalent circuit or network. The Cauer thermal model is used in connection with embodiments as solder damage (i.e., solder area loss) is mostly observable (only) in the thermal domain.

Figure 3:
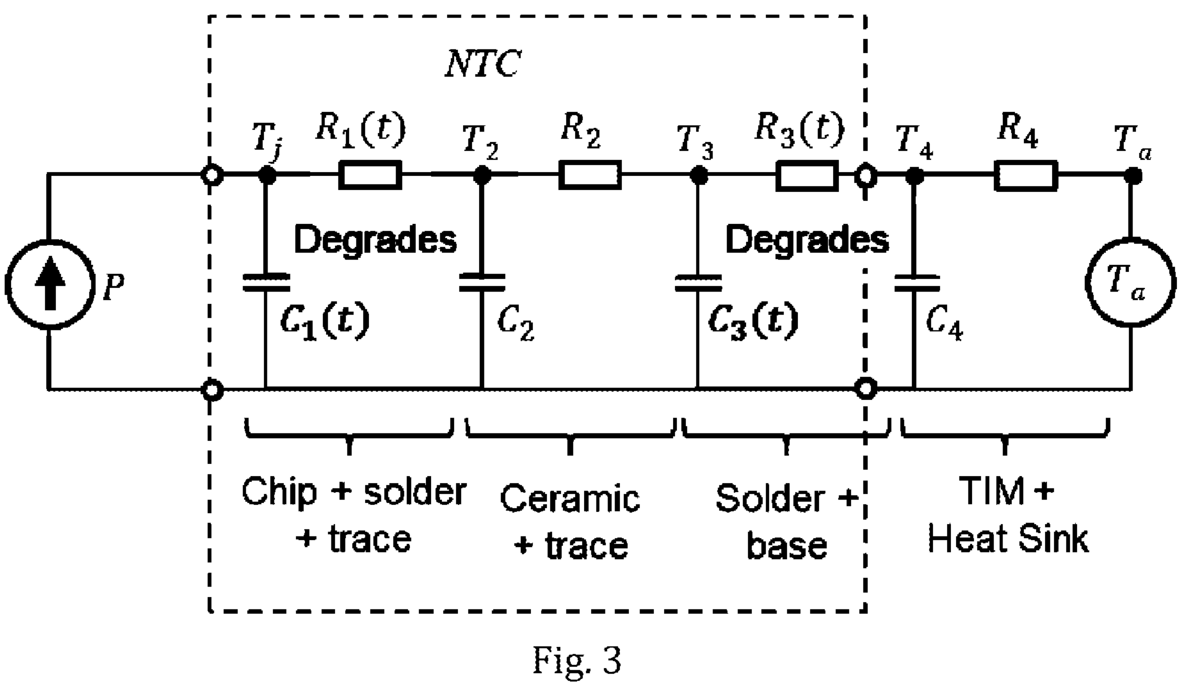
FIG. 3 illustrates an exemplary thermal model of an IGBT module according to an embodiment.

FIG. 3 illustrates a reduced Cauer thermal model modelling the IGBT module 100 of FIG. 1. The illustrated reduced Cauer thermal model is an example of a thermal circuit-based model usable (with a Bayesian filter) in connection with embodiments for evaluating thermal loss in the IGBT module.

The illustrated Cauer thermal model is reduced in the sense that the silicon chip layer, chip solder layer and the first metallic layer have been combined into a first combined layer defined by the first thermal capacitance $C_1$ and the first thermal resistance $R_1$, the ceramic insulator layer and the second metallic layer have been combined into a second combined layer defined by the second thermal capacitance $C_1$ and the second thermal resistance $R_2$, the system solder layer and the baseplate have been combined into a third combined layer defined by the third thermal capacitance $C_3$ and the third thermal resistance $R_3$ and the TIM layer and the heatsink have been combined into a fourth combined layer defined by the fourth thermal capacitance $C_4$ and the fourth thermal resistance $R_4$. In other words, the thermal capacitances and resistances of FIG. 3 are defined as follows:

$$R_1(t)=R_1^*+R_2^*(t),\ R_2=R_3^*+R_4^*,\ R_3(t)=R_5^*+R_6^*(t)+R_7^*,$$
$$R_4=R_8^*+R_9^*,\ C_1(t)=C_1^*+C_2^*(t),\ C_2=C_3^*+C_4^*,$$
$$C_3(t)=C_5^*+C_6^*(t)+C_7^* \text{ and } C_4=C_8^*+C_9^*,$$

where the resistances and capacitances marked with an asterisk (*) and having subscript indices from 1 to 9 correspond, respectively, to resistances and capacitances of layers 101 to 109 of FIG. 1. Notably, time-dependency of the resistances and capacitances is assumed here only for the chip and system solder layers (layers 102, 106 of FIG. 1).

In addition to the aforementioned (effective) layers, the reduced Cauer thermal model of FIG. 3 comprises a thermal power source corresponding to dissipated power P at the semiconductors of the IGBT module and the element P corresponding to the ambient temperature of the IGBT module. It should be noted in view of drive-related embodiments that both of said quantities are measurable by a conventional drive comprising the IGBT module.

In some embodiments, a non-reduced Cauer thermal model or another reduced Cauer thermal model (i.e., one where the combining of the layers of the IGBT module have been carried out differently) may be employed instead of the reduced Cauer thermal model of FIG. 3.

The illustrated Cauer thermal model enables evaluating the aforementioned temperature of interest, i.e., the junction temperature $T_j$, the temperature at the top metallization of the DBC substrate $T_2$, the temperature of the heatsink $T_4$ (as well as the temperature at the bottom metallization of the DBC substrate $T_3$). Namely, as thermal networks are analogous with electrical networks, the Cauer thermal model of FIG. 3 may be expressed as the following set of differential equations for the time derivatives of the temperatures $T_j$, $T_2$, $T_3$ and $T_4$:

$$\dot{T}_j(t)=\left[-\frac{1}{R_1(t)}T_j(t)+\frac{1}{R_1(t)}T_2(t)+P(t)\right]\frac{1}{C_1(t)} \quad (1)$$

$$\dot{T}_2(t)=\left[\frac{1}{R_1(t)}T_j(t)-\left(\frac{1}{R_1(t)}+\frac{1}{R_2}\right)T_2(t)+\frac{1}{R_2}T_3(t)\right]\frac{1}{C_2} \quad (2)$$

$$\dot{T}_3(t)=\left[\frac{1}{R_2}T_2(t)-\left(\frac{1}{R_2}+\frac{1}{R_3(t)}\right)T_3(t)+\frac{1}{R_3(t)}T_4(t)\right]\frac{1}{C_3(t)} \quad (3)$$

$$\dot{T}_4(t)=\left[\frac{1}{R_3(t)}T_3(t)-\left(\frac{1}{R_3(t)}+\frac{1}{R_4}\right)T_4(t)+\frac{1}{R_4}T_a(t)\right]\frac{1}{C_4}. \quad (4)$$

The nominal behavior of the IGBT module is under constant change due to progressing damage in the chip and system solder layers originating from temperature cycling, as was described above and as indicated also by defining only the thermal capacitances and resistances as being time-dependent in FIG. 3 and the above equations. The damage manifests in lost contact area of a solder layer affecting how the layer transfers and stores thermal energy.

In order to quantify thermal loss (and thus loss of contact area indicative of damage) for one or more layers of the IGBT module, one or more thermal loss parameters $A_{loss_i}$ may be defined for said one or more layers, respectively, where the index i indicates the number of the layer in the combined Cauer thermal model of FIG. 3. The one or more layers may be specifically joining (e.g., solder) layers of the IGBT module (e.g., a chip solder layer and/or a system solder layer). The values of the thermal resistance and the thermal capacitance of a given layer of the IGBT module may be dependent on a thermal loss parameter of said layer. For example, a thermal loss parameter $A_{loss\ i}$ may be related to the thermal resistance and capacitance of the corresponding layer in the Cauer thermal model as $$R_i(t)=\frac{R_{i_o}}{1-A_{loss_i}(t)}, \quad (5)$$

$$C_i(t)=C_{i_o}\left[1-A_{loss_i}(t)\right], \quad (6)$$

where the index i∈{1,3} marks the chip and system solder layers, respectively, and $R_{i_o}$ and $C_{i_o}$ correspond to initial resistance and capacitance values before deterioration due to damage for the chip and system solder layers (depending on value of i). Moreover, thermal loss parameter $A_{loss_i}$ is defined so that $A_{loss_i}\in[0,1]$ holds, where the values 0 and 1 may, for example, correspond, respectively, to 0% and 100% solder area loss for a given solder layer. Thus, initially (at time zero), the resistances $R_i(t)$ and capacitances $C_i(t)$ have values $R_{i_o}$ and $C_{i_o}$, respectively. As $A_{loss_i}(t)$ increases over time from 0 to 1, the resistances $R_i(t)$ approach infinity while the capacitances $C_i(t)$ approach zero.

In other embodiments, another definition for the thermal loss parameter and thus different equations relating them to the thermal resistance and capacitance of the layer may be employed.

The damage progression model, i.e., how the thermal loss parameter $A_{loss_i}$ for a given layer i evolves over time when the IGBT module is in use, may be formulated as $$\dot{A}_{loss_i}(t)=\theta_i A_{loss_i}(t)\left[T_i(t)-T_{i_{ref}}(t)\right], \quad (7)$$

where the index i∈{1,3} marks the chip and system solder layers, respectively, $\theta_i$ is a wear parameter for the layer i, the term $[T_i(t)-T_{i_{ref}}(t)]$ describes temperature cycling properties of the layer i (that is, this term relates to damage caused by temperature cycling) and the dot (•) in $\dot{A}_{loss_i}$ indicates time derivative. Here, $T_i$ is a temperature above the chip or system solder layer (depending on value of i), and $T_{i_{ref}}$ is a reference temperature defined for the temperature above the chip or system solder layer (depending on value of i). The reference temperature $T_{i_{ref}}$ may be, for example, the temperature at the bottom of the currently ongoing temperature cycle. The reference temperature $T_{i_{ref}}$ may be evaluated, for example, using a so-called Rainbow algorithm or other (reinforcement) machine learning algorithm. The fact that the time derivate of the thermal loss parameter $\dot{A}_{loss_i}(t)$ in (7) is directly proportional to the thermal loss parameter $A_{loss_i}(t)$ itself implies that the damage is self-amplifying. The wear parameter $\theta_i$ may be specific not only to the particular solder layer (i.e., chip or system solder layer) but also to the particular IGBT module. The wear parameter $\theta_i$ may be fixed (i.e., not to change over time) or may change over time following some (unknown) process. The thermal loss parameter $A_{loss_i}$ and the wear parameter $\theta_i$ may not be directly measurable but, instead, need to be predicted based on observations of measurable quantities such as P, $T_a$, $T_j$, $T_2$ and $T_4$, as will be described in the following.

It should be noted that, while in its nominal form the Cauer model may be expressed with linear state equations, the addition of the damage progression models, and the associated one or more (unknown) wear parameters, leads to non-linearities.

In other embodiments, other damage progression model(s) may be employed. Also in these alternative embodiments, each of the one or more damage progression models (each quantifying the change in or a time-derivative of a given thermal loss parameter) may be dependent on an associated wear parameter, the associated thermal loss parameter itself and/or one or more temperature cycling properties of an associated layer (measurable by the apparatus).

Figure 4:
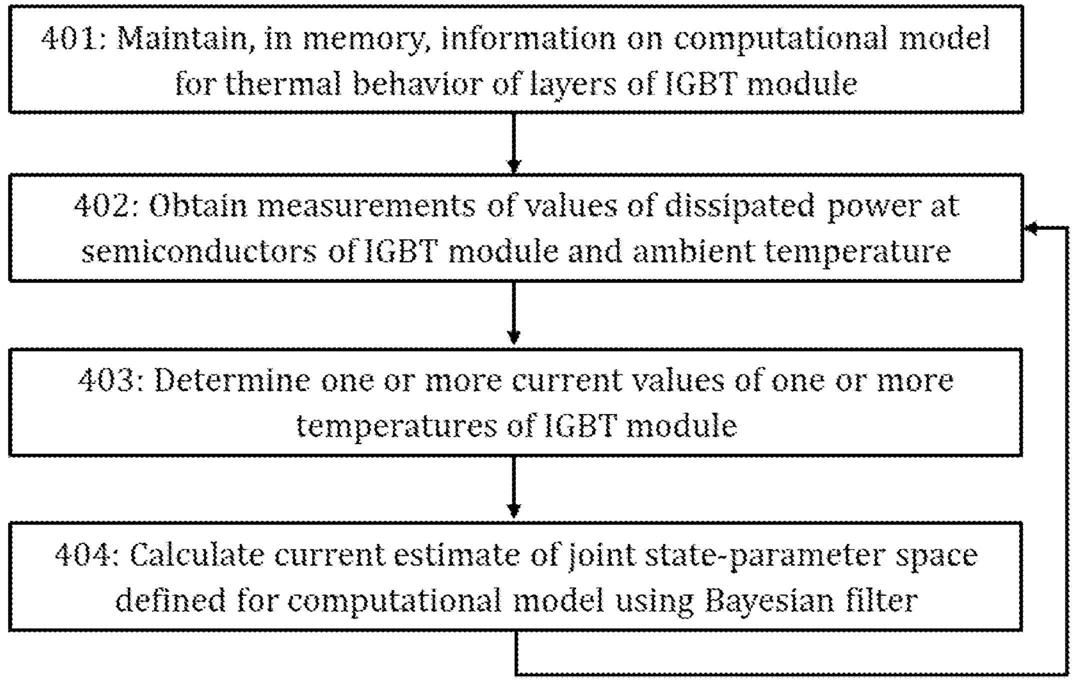
FIG. 4 illustrates an exemplary process according to embodiments for diagnosing an IGBT module.

FIG. 4 illustrates a process according to embodiments for diagnosing an IGBT module. The process may be carried out by the drive 201 of FIG. 2 or specifically by the computing device 202 of FIG. 2 comprised in the drive 201. The IGBT module to be diagnosed may correspond, e.g., to the IGBT module 100 of FIG. 1. Specifically, at least one processor of a computing device (of a drive) and at least one memory of the computing device (of a drive) for storing instructions to be executed by the at least one processor may be configured so as to cause the drive to carry out the illustrated process. In the following discussion, the actor of the process is called "the apparatus" without loss of generality.

Referring to FIG. 4, the apparatus maintains, in block 401, in a memory, information on a computational model for modelling thermal behavior of layers of the IGBT module. Here, the computational model comprises a plurality of inputs (u) comprising at least dissipated power at semiconductors of the IGBT module (P) and ambient temperature of the IGBT module ($T_a$). The dissipated power at semiconductors of the IGBT module and the ambient temperature may be (directly) measurable by the apparatus (e.g., using one or more dedicated sensors) and/or obtainable via some other means (e.g., by receiving measurement results from another apparatus for measuring dissipated power at (all) semiconductors of the IGBT module and/or ambient temperature). The computational model may enable evaluating power dissipation in one or more layers of the IGBT module and/or combined power dissipation in multiple (adjacent) layers of the IGBT module at least based on the plurality of inputs. Said evaluating may be further based on current values of one or more thermal loss parameters associated with solder area loss in one or more solder layers (e.g., due to circuit element values or other values associated with the computational model being dependent on the one or more thermal loss parameters).

In some embodiments, the computational model may comprise a thermal circuit-based model. Specifically, the computational model may comprise a Cauer thermal model such as the one discussed in connection with FIG. 3. As discussed in connection with (5)-(6), the values of the circuit elements of the Cauer thermal model may be calculated (dynamically) based on the most recent predicted values of the one or more thermal loss parameters. In other embodiments, other thermal circuit-based model such as a Foster thermal model may be employed.

In some embodiments, the computational model maintained in the memory in block 401 may further comprise one or more (separate) damage progression models quantifying a change in the one or more thermal loss parameters (or in at least some of them) over time. The one or more damage progression models may be dependent at least on one or more wear parameters (defined, e.g., via one or more random processes). The one or more damage progression models may be defined as discussed in connection with (7) above.

The apparatus obtains, in block 402, measurements of values of the dissipated power at the semiconductors of the IGBT module (P) and the ambient temperature ($T_a$). As described above, the obtaining in block 402 may comprise performing said measurements by the apparatus itself (via one or more associated sensors) and/or receiving said measurements from another apparatus which performed (or caused performing of) said measurements (or at least some of them). The obtained values of the dissipated power at the semiconductors of the IGBT module and the ambient temperature may comprise one or more consecutive (most recent) values of the dissipated power at the semiconductors of the IGBT module and the ambient temperature.

The apparatus determines, in block 403, one or more current values of one or more temperatures of the IGBT module. The one or more temperatures of the IGBT module comprise at least the junction temperature ($T_j$ of FIG. 3). The determining in block 403 comprises at least obtaining a measurement of a current value of a switching delay of the IGBT module and determining a current value of a junction temperature of the IGBT module based on the current value of the switching delay. The switching delay may correspond here to a turn-on time or a turn-off time. As is known in the art, switching times of an IGBT module increase with temperature (or specifically with the junction temperature of the IGBT module) which enables determining of the junction temperature based on the switching delay. Specifically, the current value of the junction temperature of the IGBT module may be determined in block 403 based on the current value of the switching delay by comparing the current (measured) value of the switching delay of the IGBT module to a plurality of pre-defined reference (or baseline) values for the switching delay, where each of the plurality of pre-defined reference values is associated with (or mapped to) a particular junction temperature, and determining the current value of the junction temperature of the IGBT module based on said comparing (i.e., selecting the junction temperature value associated with a pre-defined reference value for the switching delay best matching the measured value of the switching delay). The plurality of pre-defined reference values for the switching delay and the associated junction temperatures may be stored in a memory of the apparatus. The plurality of pre-defined reference values for the switching delay and the associated junction temperatures may have been determined and stored, for example, during a factory test of the drive.

In some embodiments, the determining of the current value of the junction temperature of the IGBT module in block 403 may take into account not only the current value of the switching delay but also the current value of the DC-link voltage of the drive. In other words, the apparatus may also measure the current value of the DC-link voltage and compare the combination of the current value of the DC-link voltage and the switching delay to pre-defined pairs of reference values of the DC-link voltage and the switching delay maintained in the memory of the drive, where each of said pre-defined pairs is associated with (or mapped to) a given junction temperature in the memory.

In some embodiments, the one or more temperatures of the IGBT module (for which current values are obtained in block 402) further comprise one or more layer-specific temperatures each of which relates to a temperature of a (different) layer of the IGBT module or a plurality of adjacent layers of the IGBT module. Thus, the determining of the one or more current values of the one or more temperatures in block 402 may further comprises obtaining one or more measurements of one or more current values of the one or more layer-specific temperatures, e.g., via one or more (dedicated) temperature sensors. The one or more layer-specific temperatures may comprise, for example, a temperature at a top metallization (i.e., at the first metallic layer 103 in FIG. 1) of a substrate of the IGBT module ($T_2$ of FIG. 3) and/or a heatsink temperature of the IGBT module ($T_4$ of FIG. 3). In some embodiments, the one or more layer-specific temperatures may comprise, additionally or alternatively, a temperature at a bottom metallization of the substrate of the IGBT module ($T_3$ of FIG. 3). In general, the one or more layer-specific temperatures may comprise temperature of one or more of the layers 101 to 109 of FIG. 1.

The apparatus calculates, in block 404, a current estimate of a joint state-parameter space defined for the computational model using a Bayesian filter in combination with the computational model taking as inputs at least the obtained values of the dissipated power and the ambient temperature.

It may be assumed that blocks 402 to 404 are carried out continuously starting from some pre-defined initial estimate for the joint state-parameter space (as indicated by the arrow connecting block 404 back to block 402). Thus, it may be assumed, in block 404, that the previous estimate(s) for the joint state-parameter space as well as the previous value(s) of the dissipated power and the ambient temperature are known. The calculation in block 404 using the Bayesian filter may be based also on these previous estimate(s) and value(s). For example, these previous estimate(s) and/or value(s) (or at least the more recent one) may be used in the Cauer thermal model (i.e., for calculations based on (1)-(6)) and/or in the one or more damage progression models for the one or more layers of the IGBT module.

The joint state-parameter space comprises at least

- said one or more temperatures of the IGBT module (also used as observation variables),
- one or more thermal loss parameters quantifying thermal loss (and consequently of damage) in one or more layers of the IGBT module and
- one or more wear parameters quantifying a change (or specifically unknown change) in the one or more thermal loss parameters over time due to unknown wear.

Here, the one or more temperatures of the IGBT module and the one or more thermal loss parameters may be considered to define a state of the IGBT module while the one or more wear parameters are the parameters of the joint state-parameter space.

In general, the difference between variables defining the state of the IGBT module and parameters is that, for the variables defining the state, information on how they evolve over time is available via the computational model (e.g., via the Cauer thermal model and damage progression models defined for individual layers) while the behavior of the parameters over time is unknown.

In some embodiments, the joint state-parameter space may further comprise one or more further temperatures of the IGBT module (e.g., one or more layer-specific temperatures not used as observations).

For example, the joint state-parameter space may be defined as $$x(t)=\left[T_j(t)T_2(t)T_3(t)T_4(t)A_{loss_1}(t)A_{loss_3}(t)\theta_1\theta_3\right]^T, \tag{8}$$

where x(t) is a vector defining the joint state-parameter space, $T_j(t)$, $T_2(t)$, $T_3(t)$ and $T_4(t)$ are the temperatures of the IGBT module (defined as described, e.g., in connection with FIG. 3), $A_{loss_1}(t)$ and $A_{loss_3}(t)$ are thermal loss parameters indicative of thermal loss, respectively, to the chip solder layer and the system solder layer of the IGBT module, $\theta_1$ and $\theta_3$ are wear parameters quantifying a change, respectively, in the thermal loss parameters $A_{loss_1}(t)$ and $A_{loss_3}(t)$ and T indicates a transpose operation.

The one or more current values of the one or more temperatures are used as observations (i.e., current values of observation variables) in the Bayesian filter in block 404. Thus, the measured observation variable vector y(t) may be, for example, defined as $$y(t)=[T_j(t)T_2(t)T_4(t)]^T. \tag{9}$$

In other embodiments, the number and/or type of the temperatures of the IGBT module, the number and/or type of thermal loss parameters, the number and/or type of the wear parameters and/or the number and/or type of the one or more temperatures used as observations may differ from the examples of (8) & (9). Type may refer here specifically to which particular layer(s) of the IGBT module a given quantity (e.g., temperature, thermal loss parameter or wear parameter) relates.

In some embodiments, the Bayesian filter may be a particle filter. Particle filtering uses a set of particles (i.e., samples of a distribution) to represent the posterior distribution of a stochastic process given the noisy and/or partial observations. Each particle has a likelihood weight assigned to it that represents the probability of that particle being sampled from the probability density function. In other words, the objective of a particle filter is, in general, to estimate the posterior density of state variables given certain observation variables (here at least the junction temperature and optionally one or more layer-specific temperatures). The particle filter is designed for a hidden Markov Model, where the system consists of both hidden and observable variables. The observable variables (observation process) are related to the hidden variables (state-process) by some functional form that is known (here defined using the computational model comprising, e.g., the Cauer thermal model). Here and in the following, the observable variables are denoted by $Y_0, \ldots, Y_k$ (or $y_0, \ldots, y_k$ when talking about a probability distribution) while the hidden variables are denoted by $X_0, \ldots, X_k$ (or $x_0, \ldots, x_k$ when talking about a probability distribution), k being a positive integer. Similarly, the dynamical system describing the evolution of the state variables is also known probabilistically. All Bayesian estimates $X_k$ follow from the posterior probability density $p(x_k|y_0, \ldots, y_k)$. The particle filter methodology provides an approximation of these conditional probabilities using the empirical measure associated with a genetic type particle algorithm.

In other words, the apparatus uses, in block 404, the particle filter for estimating the vector x(t) by predicting one time step ahead using the described computational model, and then updates the estimate based on the likelihood of the observations (here, the current values of the one or more temperatures comprising at least the junction temperature and optionally one or more layer-specific temperatures). In particular, the particle filter is used here for estimating values of the wear parameters which cannot be evaluated using other, more direct means (namely, using the computational model such as the Cauer thermal model and damage progression models). The process is continuous whereby the actions are repeated for consecutive time steps.

Determining the wear parameters $\theta=[\theta_1\ \theta_3]^T$ enables solving how the damage progresses in an IGBT module (as other terms of (7) are known or can be evaluated). To succeed in this task, it is important that changes in the wear parameter estimates manifest in the model outputs. After all, it is the error between the outputs and the measurements which drives the estimation. For example, the process noise added to any of the thermal loss parameters (e.g., $A_{loss_1}$) must be kept small enough, so that it does not overcome variation in the associated wear parameter (e.g., $\theta_1$). Only then the wear parameter significantly impacts the outputs, and the filter has means to weight particles with $\theta_1$ estimates closest to the true value.

Estimation of the one or more wear parameters $\theta_k$ differs from that of the rest of the state variables as their transitions are not known (and cannot be measured or evaluated, at least not easily). For example, they may be constant or vary in time through an unknown process. In either case, in order to estimate their value using the Bayesian (or particle) filter, they must be assigned some value. In general, the one or more wear parameters are defined via one or more random processes. In some embodiments, the extent or amount of randomness in the one or more random processes defined for the one or more wear parameters may be adjusted over time based on a level of convergence of values of the one or more wear parameter so as to enable expedited convergence and efficient tracking. The extent or amount of randomness may correspond here, e.g., to a variance of noise.

Said one or more random processes for defining values of the one or more wear parameters may be, for example, random walk process(es). A random walk process for a wear parameter vector $\theta_k=[\theta_{1,k}\ \theta_{3,k}]^T$ may be defined using the equation $$\theta_k=\theta_{k-1}+\xi_{k-1}, \tag{10}$$

where k and k−1 indicate, respectively, k-th and (k−1)-th steps and $\xi_{k-1}$ is a vector sampled from a distribution, often from a zero-mean Gaussian distribution. Thus, the wear parameters are evolved randomly, and it is up to the Bayesian filter (or particle filter) to apply weights to the particles based on how close the wear parameter estimates (of the particles) are to the true values.

In some embodiments, the Bayesian filter may be specifically a sampling importance resampling (SIR) filter (equally called a sequential importance resampling filter). A SIR filter is a type of particle filter which approximates the filtering probability density $p(x_k|y_0, \ldots, y_k)$ by a weighted set of N samples $$\{(w_k^{(i)}, x_k^{(i)}): i \in \{1, \ldots, N\}\}$$

(N being a positive integer and $$w_k^{(i)}$$

being the ith applied weight) and uses resampling to avoid the problem of degeneracy of the algorithm (i.e., avoiding the situation that all but one of the importance weights are close to zero).

In the following, a pseudo-code example of a SIR filter is presented. The SIR filter takes as inputs the previous versions with time index k−1 of the vector defining a state space $s_{k-1}$ (i.e., defining the one or more temperatures of the IGBT module and the one or more thermal loss parameters), the vector defining the one or more wear parameters $\theta_{k-1}$, the plurality of inputs of the computational model of the IGBT module (comprising, e.g., the Cauer thermal model) $u_{k-1}$ & $u_k$ and the updated version with time index k of the measured observation variable vector $y_k$ (see line 1). In other words, the inputs comprise at least the posterior particles $s_{k-1}$, $\theta_{k-1}$ and $u_{k-1}$ corresponding to time index k−1 and the most recent observations of the observation variables $y_k$ corresponding to time index k. It should be noted that the joint state-parameter space (for index value k−1) corresponds here to a combination of the (row) vectors $s_{k-1}$ and $\theta_{k-1}$ so that $x_{k-1}=[s_{k-1}\ \theta_{k-1}]^T$. In the pseudocode example, also $u_k$ is an input of the computational model of the IGBT module (on line 1) though this may be considered optional. The inclusion of $u_k$ as an input of the computational model of the IGBT module may depend on the particular computational model employed. The number of particles used in the illustrated algorithm (i.e., the number of different values for each of $s_{k-1}$, $s_k$, $\theta_{k-1}$ and $\theta_k$) is $n_s$. A typical value of $n_s$ may be, for example, 1000. For each value of particle index i, prior wear parameters $\theta_k$ and prior state space $s_k$ with time index k are predicted based on associated posterior densities (lines 3-4). Weights for the particles are updated based on the likelihood of the current observations $y_k$ given the predicted $s_k^i$ and $\theta_k^i$ and known (e.g., measured) $u_k$ (line 5). The inclusion of $u_k$ on line 5 may be considered optional. The weights for all particles summed up to form parameter W (line 7) and each weight of a particle is normalized to said parameter W(lines 8-10). The vector defining the state space $s_k$ and the vector defining the one or more wear parameters $\theta_k$ are both resampled based on the normalized weights of the particles (line 11). The SIR filter provides, as outputs, updated versions (with index k) of the vector defining the state space $s_k$ and the vector defining the one or more thermal loss parameters $\theta_k$ (line 12). Said exemplary SIR filter implementation employs systematic resampling as a resampling algorithm due to its computational simplicity and decent empirical performance (though other resampling algorithms may be used in other embodiments).

Algorithm 1 SIR Filter

1: function SIR($s_{k-1}$, $\theta_{k-1}$, $u_{k-1:k}$, $y_k$) ▷ Posterior particles, new meas
2: for i = 1:$n_s$ do
3: $\theta_k^i \sim p(\theta_k \mid \theta_{k-1}^i)$ ▷ Prediction: prior params
4: $s_k^i \sim p(s_k \mid s_{k-1}^i, \theta_{k-1}^i, u_{k-1}^i)$ ▷ Prediction: prior state
5: $w_k^i \leftarrow p(y_k \mid s_k^i, \theta_k^i, u_k^i)$ ▷ Update: weights from likelihood
6: end for -continued

| Algorithm 1 SIR Filter | | |
|---|---|---|
| 7: | $W \leftarrow SUM(w_k)$ | |
| 8: | for $i = 1{:}n_s$ do | |
| 9: | $w_k^i \leftarrow w_k^i/W$ | ▷ Normalize weights |
| 10: | end for | |
| 11: | $[s_k, \theta_k] \leftarrow RESAMPLE(s_k, \theta_k, w_k)$ | ▷ Resample: posterior |
| 12: | return $s_k, \theta_k$ | |
| 13: | end function | |

When random walk processes are used for deriving values for the one or more wear parameters, the estimation performance of the wear parameters is highly dependent on the variance of noise added to a given random walk process. Therefore, in some embodiments, the apparatus may adjust, during consecutive executions of block 404, a variance of noise ($v_\xi$) added in a random walk process (such as the one described in connection with (10)) over time based on a level of convergence of values of a given wear parameter so as to enable expedited convergence and efficient tracking. The variance of noise may be adjusted for all or only some of the one or more wear parameters. More specifically, the used noise adaptation algorithm may be configured to initially try to keep the wear parameter estimate wide to promote convergence, leading a large variance for the distribution. Once convergence is achieved, the wear parameter estimate may be narrowed down to small variance. The latter is important so that all unnecessary uncertainty in the estimate can be suppressed, as it would propagate to any subsequent prediction such as to end of life (EoL) and RUL predictions (to be discussed below in detail).

In the following, a pseudo-code example of a process for adapting a variance of noise ($v_\xi$) added in a random walk process is presented.

| Algorithm 2 Adapt $v_\xi$ | | |
|---|---|---|
| 1: | function NOISE ADAPTATION($\theta_k$, $v_{\xi,k-1}$) | |
| 2: | for $j = 1{:}\ n_\theta$ do | ▷ For every wear parameter |
| 3: | $v(j) \leftarrow RMAD(\theta_k(j))$ | |
| 4: | if $v(j) < t(j, \sigma(j))$ then | ▷ If below threshold |
| 5: | $\sigma(j) \leftarrow \sigma(j) + 1$ | ▷ Change stage |
| 6: | end if | |
| 7: | $v_{\xi,k}(j) = v_{\xi,k-1}(j)\left[1 - P(j, \sigma(j))\frac{v(j) - v^*(j, \sigma(j))}{v^*(j, \sigma(j))}\right]$ | ▷ Update var |
| 8: | end for | |
| 9: | return $v_{\xi,k}$ | |
| 10: | end function | |

The illustrated algorithm is fundamentally a type of a P controller (P standing for proportional). The illustrated process is repeated for every wear parameter (see line 2 where $n_\theta$ denotes the number of wear parameters and j is an index for a wear parameter). The algorithm uses the relative median absolute deviation (RMAD) as a metric for the variance v of each wear parameter estimate $\theta_j$, (see line 3) and tries to control this metric to a user-specified level by adjusting the added random-walk variance $v_\xi(j)$. If the current RMAD v(j) is smaller than a set target RMAD t(j, σ(j)), $v_{\xi,k}(j)$ is increased, and, conversely, if the RMAD is larger than (or equal to) the set target RMAD t(j, σ(j)), $v_{\xi,k}(j)$ is decreased (see line 7). Here, j is an index indicating the wear parameter of $n_\theta$ wear parameters and σ is a vector defining stages of the algorithm for the $n_\theta$ wear parameters (see next paragraph for further details). The rate of increase/decrease is defined by the proportional gain term P(j, σ(j)) which may also be settable by the user (or it may be pre-defined). The algorithm outputs a variance vector $v_{\xi,k}$ defining variance of noise for each of the one or more wear parameters (see line 9).

The desired behavior (i.e., quick convergence and narrow tracking) may be achieved by specifying the target RMAD differently for two stages, i.e., for σ(j)=1 & σ(j)=2. The stage is changed for a given wear parameter (index j) in response to the current RMAD being below a pre-defined threshold t(j, σ(j)) (see lines 4-6). For convergence, the target RMAD should be set to be large so as to target a wide distribution, whereas for tracking, the target RMAD should be set small so that a narrow distribution is maintained. The stage a(j), and, as a consequence, the value for $v_{\xi,k}(j)$ is changed if v(j) falls below the threshold t(j). Technically, a pre-defined number of stages may be used (e.g., 2). In other embodiments, a different number stages (i.e., only one stage or more than two stages) may be used.

Figure 5:
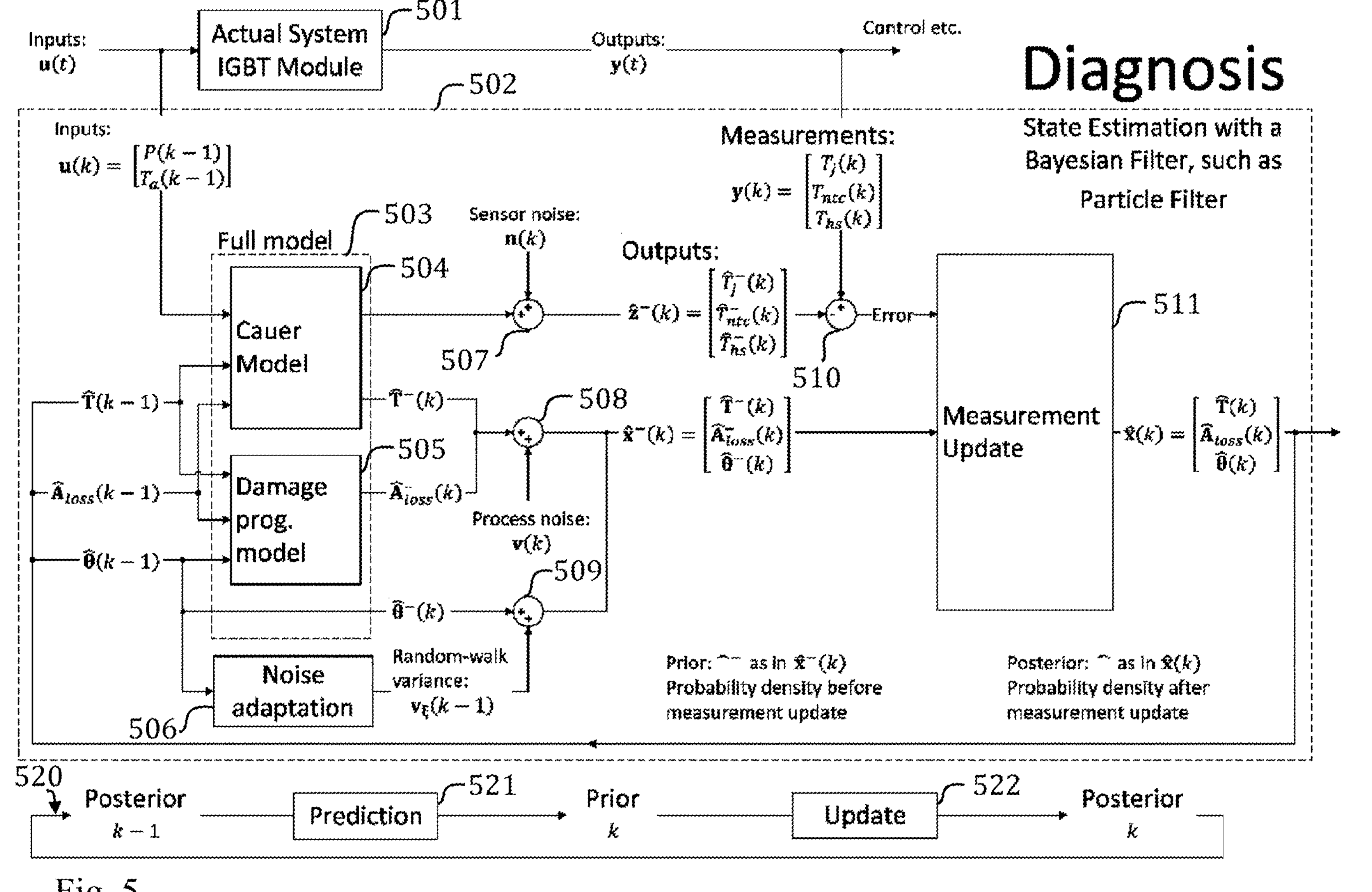
FIG. 5 illustrates an exemplary architecture according to embodiments for diagnosing an IGBT module.

FIG. 5 provides a schematic presentation of an exemplary diagnosis system. The illustrated exemplary diagnosis system corresponds fully to the specific example of a diagnosis process discussed above (in connection with FIG. 4). At least some of the element shown in FIG. 5 may be functional entities (but not necessarily corresponding to any one physical entity). The connections shown in FIG. 5 are logical connections (the actual physical connections may be different).

Referring to FIG. 5, the diagnosis system comprises an IGBT module 501 and a computing device (or system) 502 for performing diagnosis comprising a plurality of functional elements 503 to 511. Said plurality of functional elements comprise a full computation model 503 comprising a Cauer thermal model 504 and a damage progression model(s) 505, a noise adaptation element 506 and a measurement update element 511. Additionally, said plurality of functional elements comprise a plurality summing elements 507 to 509, 511 and a subtraction element 510. As described above, the diagnosis 502 may be implemented using a Bayesian filter such as a particle filter (e.g., a SIR filter).

In the following, each of the elements of FIG. 5 is discussed in further detail. It should be noted that, in FIG. 5 and in the following, a dash (-) in the superscript is used for denoting probability densities before the measurement update 511 while a "hat" (^) in the superscript is used for denoting probability densities after the measurement update 511. As illustrated in the bottom part 520 of FIG. 5, three different types of quantities (or distributions) are involved in FIG. 5: posterior distribution quantities corresponding to index value k−1, prior distribution quantities corresponding to index value k and derived via prediction (or simulation) 521 and new posterior distribution quantities corresponding to index value k and derived via measurement-based update 522.

The Cauer thermal model 504 may be defined as discussed above (e.g., in connection with FIG. 3). The Cauer thermal model 504 takes as inputs the input vector u(k) defining the aforementioned plurality of inputs (at least the dissipated power at the semiconductors of the IGBT module P(k−1) and the ambient temperature $T_a(k-1)$), a temperature vector $\hat{T}(k-1)$ defining the one or more temperatures and a thermal loss parameter vector $\hat{A}_{loss}(k-1)$ defining the one or more thermal loss parameters and provides, as outputs, at least the values of the one or more temperatures of the IGBT module, that is, at least the same temperatures which are used also as observation variables in Bayesian filter ($T_j$, $T_{ntc}$ and $T_{hs}$ corresponding, respectively, to $T_j$, $T_2$ and $T_4$ mentioned above). Notably, all the inputs of the Cauer thermal model 504 correspond to the same (time) index k−1. The thermal loss parameter vector $\hat{A}_{loss}(k-1)$ may be used in deriving values of the circuit elements in the Cauer thermal model, as described in connection with (5) & (6). The temperature vector $\hat{T}(k-1)$ may be employed in (1)-(4).

The Cauer thermal model 504 output the simulated or predicted (prior) observation variable vector $$\hat{z}^-(k) = [\,T_j^-(k)\quad T_{ntc}^-(k)\quad T_{hs}^-(k)\,]^T$$

as well as a simulated or predicted (prior) temperature vector $\hat{T}^-(k)$ defining all the temperatures included in the Cauer thermal model (both ones used as observation variables and ones not used as observation variables, if such exist).

The damage progression model(s) 505 may also be defined as discussed above (e.g., in connection with equation (7)). The Cauer thermal model 504 takes, as inputs, a temperature vector $\hat{T}(k-1)$ defining the one or more temperatures, a thermal loss parameter vector $\hat{A}_{loss}(k-1)$ defining the one or more thermal loss parameters and a wear parameter vector $\hat{\theta}(k-1)$ defining the one or more thermal loss parameters and provides, as outputs, at least a predicted (prior) version for the thermal loss parameter vector $\hat{A}^-_{loss}(k)$ (i.e., a version corresponding to the next time step).

The full model 503 is also used for determining a predicted (prior) version of the wear parameter vector $\hat{\theta}^-(k)$. As described above, the predicted (prior) version may be derived, for example, using one or more random process such as one or more random walk processes as noted in FIG. 5. The noise adaptation element 506 is used for generating a variance of noise $v_\xi(k-1)$ which is subsequently added to the predicted (prior) wear parameter vector $\hat{\theta}^-(k)$ in summing element 509. The noise adaptation element 506 may implement, for example, the Algorithm 2 described above.

As the parameters derived from the Cauer thermal model 504 are noiseless, a noise element n(k) and a process noise element v(k) are added, respectively, to the two outputs of the Cauer thermal model 504 in summing elements 507, 508. Similarly, the process noise element v(k) is added also to the output of the damage progression model 505 in element 508.

Similar to as described above, the one or more current values of the one or more temperatures of the IGBT module (here denoted as the measured observation variable vector $y(k)=[T_j(k)T_{ntc}(k)T_{hs}(k)]^T$) are measured from the IGBT module 501 and used as observations (i.e., current values of observation variables) in the Bayesian filter. To enable this, the simulated (or predicted) observation variable vector $$\hat{z}^-(k) = [\,T_j^-(k)\quad T_{ntc}^-(k)\quad T_{hs}^-(k)\,]^T$$

originating from the full computation model 503 is subtracted from the measured observation variable vector y(k) in the subtraction element 510 so as to derive an error vector.

The measurement update element 510 takes, as inputs, said error vector as well as a state-parameter space vector $\hat{x}^-(k)$ comprising the predicted (prior) temperature, thermal loss parameter and wear parameter vectors $\hat{X}^-(k)=[\hat{T}^-(k)\ \hat{A}^-_{loss}(k)\hat{\theta}^-(k)]^T$. The measurement update element 510 updates the state-parameter space vector $\hat{x}^-(k)$ based on the error vector (describing the error between the measurements and the simulations), thus deriving a new (measurement-corrected) updated state-parameter space vector $\hat{x}(k)=[\hat{T}(k)\ \hat{A}_{loss}(k)\hat{\theta}(k)]^T$.

Figure 6:
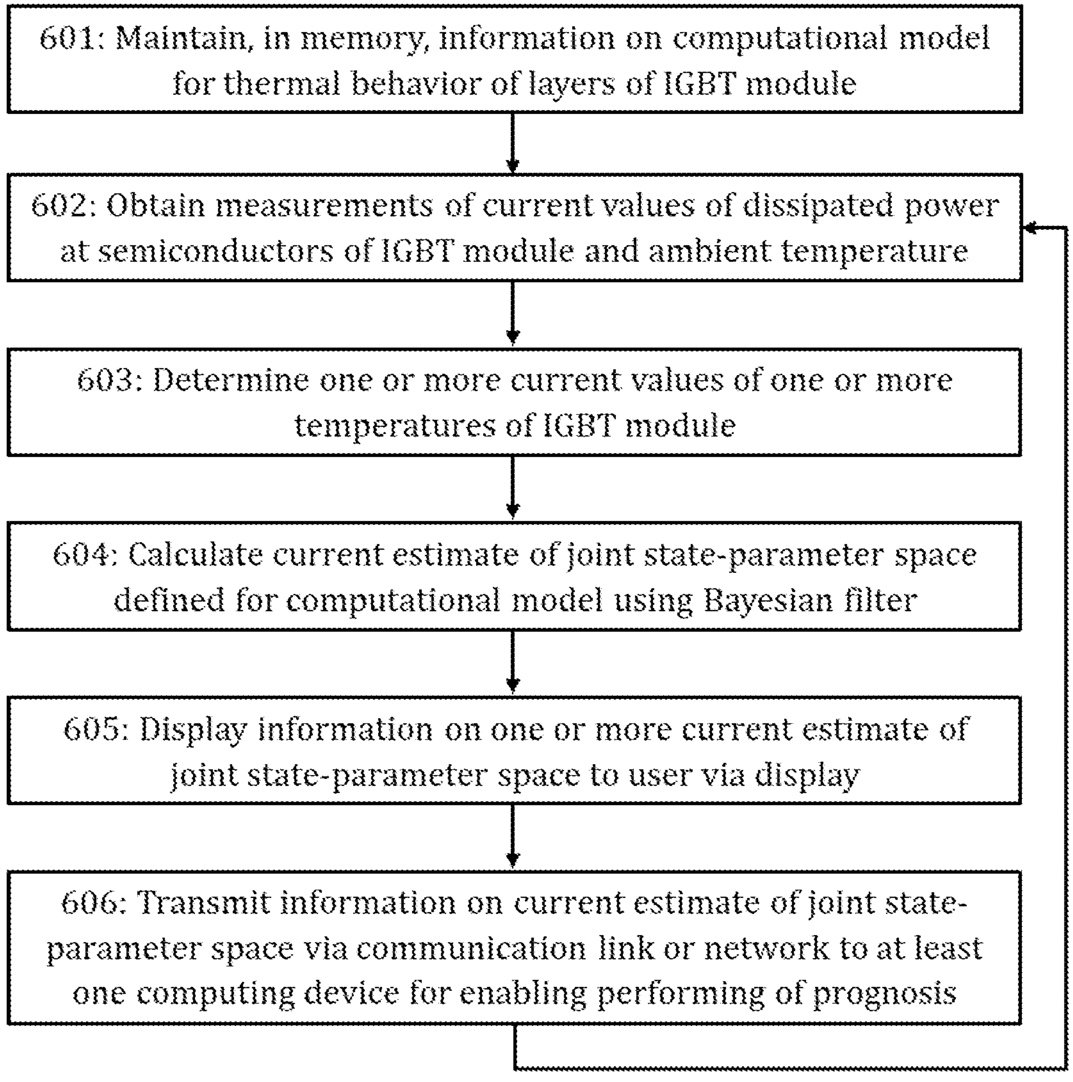
FIG. 6 illustrates an exemplary process according to embodiments for diagnosing an IGBT module.

FIG. 6 illustrates another process according to embodiments for diagnosing an IGBT module. The process may be carried out by the drive 201 of FIG. 2 or specifically by the computing device 202 of FIG. 2 comprised in the drive 201. The IGBT module to be diagnosed may correspond, e.g., to the IGBT module 100 of FIG. 1. Specifically, at least one processor of a computing device (of a drive) and at least one memory of the computing device (of a drive) for storing instructions to be executed by the at least one processor may be configured so as to cause the drive to carry out the illustrated process. In the following discussion, the actor of the process is called "the apparatus" without loss of generality.

The process of FIG. 6 corresponds predominantly to the process of FIG. 4. Blocks 601 to 604 may correspond fully to blocks 401 to 404 of FIG. 4. Any of the features described above (e.g., in connection with FIGS. 4 and/or 5) may apply also for the process of FIG. 6.

Following the calculation of the current estimate of the joint state-parameter space (i.e., $\hat{x}(k)$ using the notation of FIG. 5) in block 604, the apparatus displays or causes displaying, in block 605, information on the current estimate of the joint state-parameter space to a user via a display (e.g., a display of the drive or a display of a user device communicatively connected to the apparatus). All or only some of the information relating to the current estimate of the joint state-parameter space may be displayed. For example, one or more current values of one or more thermal loss parameters and/or one or more wear parameters may be at least displayed. Based on the displayed information, the user may be able to evaluate the current level of (solder) damage in the IGBT module.

The apparatus transmits or causes transmitting, in block 606, information on the updated current estimate of the joint state-parameter space (i.e., $\hat{x}(k)$ using the notation of FIG. 5) via at least one communication link and/or network to at least one computing device for enabling performing of prognosis (i.e., predicting future behavior of the IGBT module). Said at least one communication link and/or network may comprise one or more wireless and/or wired communication links and/or networks. While the apparatus could also perform the prognosis itself (as will be described in connection with FIG. 7), it may be beneficial, in some cases, to only perform the diagnosis locally in the apparatus (e.g., in the drive) while leaving the typically more computationally demanding prognosis to be performed by another device (e.g., a remote server). The other device may be a device dedicated for performing the prognosis and/or it may have computational resources available to it compared to the apparatus comprised in a drive.

In some embodiments, only one of the actions pertaining to blocks 605, 606 may be carried out (i.e., one of blocks 605, 606 may be omitted).

As indicated above, the apparatus may be configured not only to perform diagnosis of the IGBT module but also prognosis of the IGBT module (that is, prediction of future behavior of the IGBT module). FIG. 7 illustrates a process according to embodiments for performing prognosis for an IGBT module. The process may be carried out by the drive 201 of FIG. 2 or specifically by the computing device 202 of FIG. 2 comprised in the drive 201. The IGBT module for which prognosis is to be performed may correspond, e.g., to the IGBT module 100 of FIG. 1. Specifically, at least one processor of a computing device (of a drive) and at least one memory of the computing device (of a drive) for storing instructions to be executed by the at least one processor may be configured so as to cause the drive to carry out the illustrated process. In the following discussion, the actor of the process is called "the apparatus" without loss of generality.

The prognosis may take advantage of the same computational model as described for the diagnosis (or a copy thereof).

Referring to FIG. 7, the apparatus may initially carry out, in block 701, diagnosis of the IGBT module. The diagnosis may be performed, e.g., according to any of FIGS. 4 to 6. The diagnosis in block 701 may involve calculating one or more consecutive estimates of the joint-parameter space (i.e., of $\hat{x}(k)$ using the notation of FIG. 5).

After the diagnosis phase 701, the apparatus simulates, in block 702, consecutive future estimates of the joint state-parameter space of the computational model using the Bayesian filter starting from the (most recent) updated current estimate of the joint state-parameter space (i.e., current $x_k$ or $\hat{x}(k)$) until a pre-defined failure threshold for at least one of the one or more thermal loss parameters is reached. The computational model and the Bayesian filter may be the same computational model and Bayesian filter as used in the diagnosis phase. Thus, any of the definitions for the computational model and/or the Bayesian model provided apply, mutatis mutandis, also here. The pre-defined failure threshold may be defined differently for each (or at least some) of the one or more thermal loss parameters. More specifically, in the case of a (discrete) particle filter, each particle is simulated forward in time with the computational model, starting from a certain prediction time instant $k_P$, until the pre-defined failure threshold is reached.

The apparatus calculates, in block 703, a remaining useful life (RUL) estimate for the IGBT module based on results of the simulating. Namely, the apparatus may, first, determine the end-of-life (EoL) distribution based on the intersection of the predicted damage progression paths and the pre-defined threshold (which are assigned the same weights the particles had at $k_P$). Then, the apparatus may calculate the RUL estimate (i.e., a RUL distribution) by subtracting the prediction time instant $k_P$ (i.e., current time) from the EoL distribution.

Following the calculation of the RUL estimate, the apparatus displays or causes displaying, in block 704, the RUL estimate (and optionally also the EoL distribution) to a user via a display (e.g., a display of the drive or a display of a user device communicatively connected to the apparatus) (similar to as described for the diagnosis results in connection with block 605 of FIG. 6). Based on the displayed information, the user is, for example, able to evaluate the need (or urgency) for replacing the IGBT module.

In some embodiments, block 704 of FIG. 7 may be omitted.

An example of a detailed implementation of the process of blocks 702, 703 is shown below in pseudocode. The illustrated algorithm filter takes as inputs the current versions (with index $k_P$) of the vector defining the joint state-parameter space $$x^i_{k_P}$$

and the vector defining the one or more thermal loss parameters $$\theta^i_{k_P}$$

(see line 1). In other words, the inputs comprise the posterior particles $$x^i_{k_P}$$

and $$\theta^i_{k_P}.$$

The number of particles used in the illustrated algorithm is $n_s$, similar to Algorithm 1 (SIR filter). For each value of particle index i while the pre-defined threshold defined (separately) for at least one of the one or more thermal loss parameters $$\theta^i_{k_P}$$

(e.g., for a thermal loss parameter associated with chip solder area loss) is not reached, the next future inputs $\hat{u}_k$ are predicted, for example, based on input history and/or a sequence of inputs for generating a worst case scenario (line 5) and future wear parameters $\theta_k$ and future joint state-parameter space $x_k$ are predicted based on associated posterior densities (lines 6-7). After said predictions, the next time step (next value for index k) is selected (line 8). Once the pre-defined threshold has been reached for a given particle, the end value for k corresponds to the EoL for that particle. Jointly these end values for k form the EoL distribution. The prediction time instant $k_P$ is subtracted from the EoL distribution k (having $n_s$ particles) to acquire the RUL distribution (line 11).

Algorithm 3 Predict RUL

```
1:  function PROGNOSIS(s^i_{kP}, θ^i_{kP})
2:    for i = 1:n_s do                              ▷ For every particle
3:      {k, s^i_k, θ^i_k} ← {k_P, s^i_{kP}, θ^i_{kP}}
4:      while Threshold not reached do
5:        u_k ← PREDICTFUTUREINPUTS( . . . )
6:        θ^i_{k+1} ~ p(θ_{k+1} | θ^i_k)              ▷ Predict parameters
7:        s^i_{k+1} ~ p(s_{k+1} | s^i_k, θ^i_k, û^i_k),   ▷ Predict state
8:        {k, s^i_k, θ^i_k} ← {k + 1, s^i_{k+1}, θ^i_{k+1}}
9:      end while
10:   end for
```

-continued

| Algorithm 3 Predict RUL | | |
|---|---|---|
| 11: | $RUL^i_{k_P} \leftarrow k - k_P$ | ▷ Predict EOL - present |
| 12: | return | |
| 13: | end function | |

In some embodiments, a pre-defined threshold may be defined, in addition or alternative to at least one thermal loss parameter, for the junction temperature.

While it was assumed above that both the diagnosis and the prognosis are performed by the same apparatus, in other embodiments, the apparatus carrying out the prognosis (e.g., the process of FIG. 7) may be a different apparatus than the apparatus which performs the diagnosis (e.g., the process of FIG. 4). Referring to FIG. 2, the diagnosis may be performed by the computing device 202 of the drive 201 while the prognosis may be performed by a server 205 communicatively connected to the drive 201. The results of the diagnosis may be transmitted from the drive to the server, as described in connection with block 606 of FIG. 6. In these embodiments, the apparatus may, following the prognosis, transmit or cause transmitting the RUL estimate to another device (e.g., to the drive or a terminal device of a user such as a smart phone of a user) via a wired or wireless network or link. Subsequently, the RUL estimate may be displayed to the user via a display of that another device. Moreover, in these embodiments, both apparatuses should maintain, in a memory, the same computational model so that the diagnosis results are compatible with the device performing the prognosis.

Figure 8:
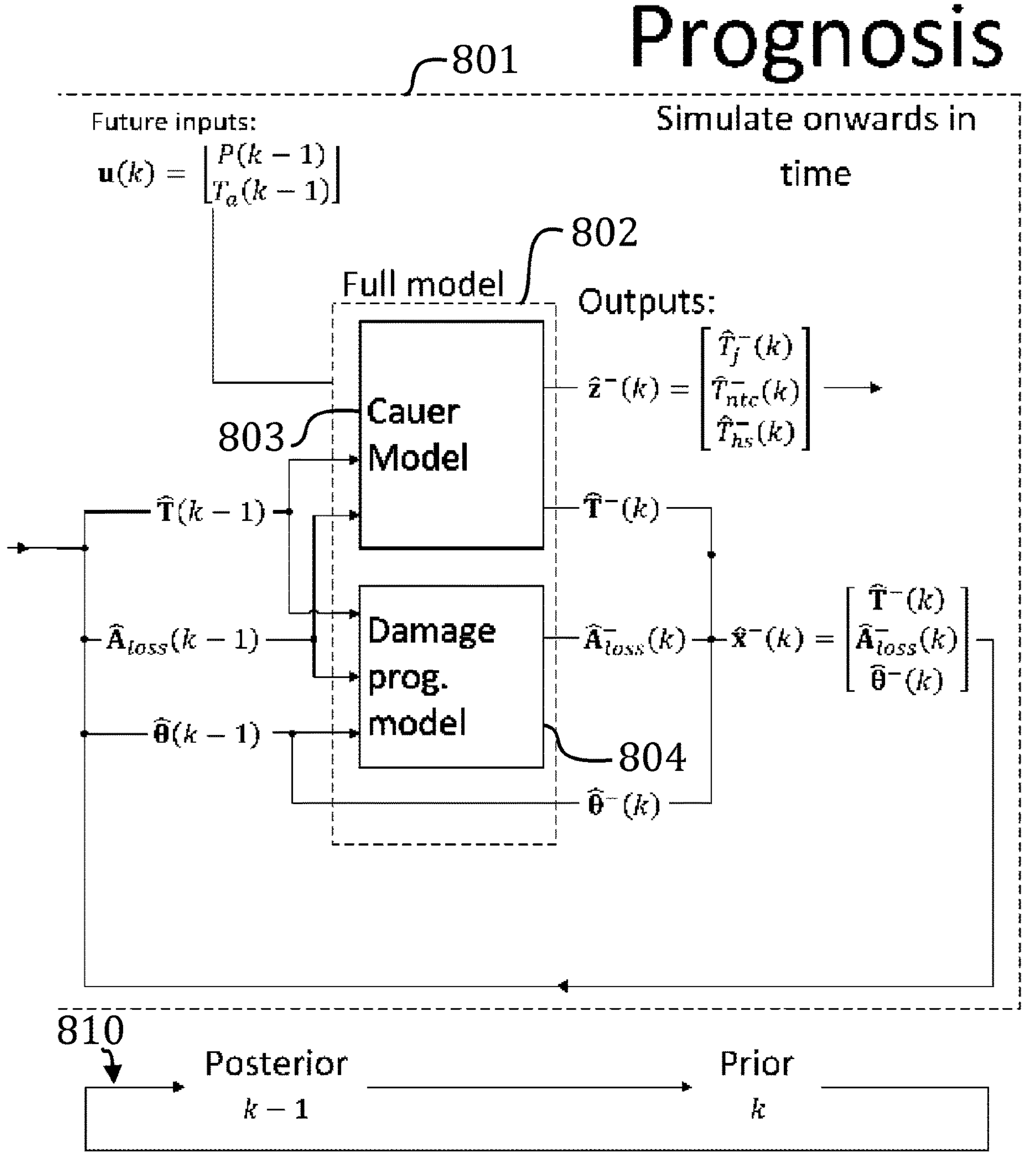
FIG. 8 illustrates an exemplary architecture according to embodiments for performing prognosis on an IGBT module.

FIG. 8 provides a schematic presentation of an exemplary prognosis system. The illustrated exemplary diagnosis system corresponds fully to the specific example of a diagnosis process discussed above (in connection with FIG. 7). At least some of the elements shown in FIG. 8 may be functional entities (but not necessarily corresponding to any one physical entity). The connections shown in FIG. 8 are logical connections (the actual physical connections may be different).

Referring to FIG. 8, the prognosis system comprises a computing device (or system) 801 for performing prognosis comprising a plurality of functional elements 802 to 804. Said plurality of functional elements comprise a full computation model 802 comprising a Cauer thermal model 803 and a damage progression model(s) 803. The elements 803, 804 may correspond fully to elements 504, 505 of FIG. 5, respectively.

In the following, each of the elements of FIG. 8 is discussed in further detail. Similar to FIG. 5, as illustrated in the bottom part 810 of FIG. 8, two different types of quantities (or distributions) are involved in FIG. 8: posterior distribution quantities corresponding to index value k−1 and prior distribution quantities corresponding to index value k and derived via prediction (or simulation) 521.

The Cauer thermal model 803 may be defined as discussed above (e.g., in connection with FIGS. 3 and/or 5). The Cauer thermal model 803 takes as inputs the future (predicted) input vector u(k) defining the aforementioned plurality of inputs (at least the dissipated power at the semiconductors of the IGBT module P(k−1) and the ambient temperature $T_a(k-1)$), a temperature vector $\hat{T}(k-1)$ defining the one or more temperatures and a thermal loss parameter vector $\hat{A}_{loss}(k-1)$ defining the one or more thermal loss parameters and provides, as outputs, at least the values of the one or more temperatures of the IGBT module ($T_j$, $T_{ntc}$ and $T_{hs}$), that is, at least the same temperatures which were used also as observation variables in the Bayesian filter during diagnosis. Notably, all the inputs of the Cauer thermal model 803 correspond to the same (time) index k−1. The thermal loss parameter vector $\hat{A}_{loss}(k-1)$ may be used in deriving values of the circuit elements in the Cauer thermal model, as described in connection with (5) & (6). The temperature vector $\hat{T}(k-1)$ may be employed in (1)-(4).

The Cauer thermal model 803 outputs the simulated or predicted (prior) observation variable vector $$\hat{z}^-(k) = [\, T_j^-(k) \quad T_{ntc}^-(k) \quad T_{hs}^-(k) \,]^T$$

as well as a simulated or predicted (prior) temperature vector $\hat{T}^-(k)$ defining all the temperatures included in the Cauer thermal model (both ones used as observation variables and ones not used as observation variables, if such exist).

The damage progression model(s) 804 may be defined as discussed above (e.g., in connection with equation (7) and/or block 505 of FIG. 5). The Cauer thermal model 804 takes, as inputs, a temperature vector $\hat{T}(k-1)$ defining the one or more temperatures, a thermal loss parameter vector $\hat{A}_{loss}(k-1)$ defining the one or more thermal loss parameters and a wear parameter vector $\hat{\theta}(k-1)$ defining the one or more thermal loss parameters and provides, as outputs, at least a predicted (prior) version for the thermal loss parameter vector $\hat{A}^-_{loss}(k)$ (i.e., a version corresponding to the next time step).

The full model 803 is also used for determining a predicted (prior) version of the wear parameter vector $\hat{\theta}^-(k)$. As described above, the predicted (prior) version may be derived, for example, using one or more random process such as one or more random walk processes.

Here, the predicted (prior) temperature vector $\hat{T}^-(k)$, the predicted (prior) thermal loss parameter vector $$\hat{A}^-_{loss}(k)$$

and the predicted (prior) wear parameter vector $\hat{\theta}^-(k)$ outputted by the computational model 802 form the estimate for the state-parameter space $\hat{x}^-(k)$ which is here fed directly back to the computation model 802 for calculation of the next time step (next k).

The blocks, related functions, and information exchanges described above by means of FIGS. 4 to 8 are in no absolute chronological order, and some of them may be performed simultaneously or in an order differing from the given one. Other functions can also be executed between them or within them, and other information may be sent and/or received, and/or other mapping rules applied. Some of the blocks or part of the blocks or one or more pieces of information can also be left out or replaced by a corresponding block or part of the block or one or more pieces of information.

In an embodiment, at least some of the processes described in connection with FIGS. 4 to 8 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form (processing) means or comprises one or more computer program code portions for carrying out one or more operations according to any one of the embodiments of FIGS. 4 to 8 or operations thereof.

Embodiments as described may also be carried out in the form of a computer process defined by a computer program or portions thereof. Embodiments of the methods described in connection with FIGS. 4 to 8 may be carried out by executing at least one portion of a computer program comprising corresponding instructions. The computer program may be provided as a computer readable medium comprising program instructions stored thereon or as a non-transitory computer readable medium comprising program instructions stored thereon. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the embodiments have been described above with reference to examples according to the accompanying drawings, it is clear that the embodiments are not restricted thereto but can be modified in several ways within the scope of the appended claims. Therefore, all words and expressions should be interpreted broadly, and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An apparatus for diagnosing an insulated-gate bipolar transistor (IGBT) module having a plurality of layers, the apparatus comprising:

a memory configured to maintain information on a computational model for modelling thermal behavior of layers of the IGBT module, wherein the computational model includes a plurality of inputs including at least dissipated power at semiconductors of the IGBT module and ambient temperature of the IGBT module;

one or more temperature sensors configured to measure values of the dissipated power at the semiconductors of the IGBT module and the ambient temperature, the one or more temperature sensors operatively coupled to the IGBT module; and control circuitry configured to:

determine one or more current values of one or more temperatures of the IGBT module, wherein the determining includes at least measuring a current value of a switching delay of the IGBT module and determining a current value of a junction temperature of the IGBT module based on the current value of the switching delay; and calculate a current estimate of a joint state-parameter space defined for the computational model using a Bayesian filter in combination with the computational model taking as inputs at least the measured values of the dissipated power and the ambient temperature, wherein the joint state-parameter space includes at least the one or more temperatures of the IGBT module, one or more thermal loss parameters quantifying thermal loss in one or more layers of the IGBT module and one or more wear parameters quantifying a change in the one or more thermal loss parameters over time due to unknown wear, the one or more wear parameters being defined via one or more random processes, the one or more current values of the one or more temperatures being used as observations in the Bayesian filter.

2. The apparatus of claim 1, wherein the computational model comprises a thermal circuit model of the IGBT module, preferably a Cauer thermal model of the IGBT module, taking as inputs at least the values of the dissipated power and the ambient temperature.

3. The apparatus of claim 1, wherein the Bayesian filter is a particle filter, preferably a sampling importance resampling filter.

4. The apparatus of claim 1, wherein the computational model comprises one or more damage progression models quantifying a change in the one or more thermal loss parameters over time, wherein the one or more damage progression models are dependent at least on the one or more wear parameters.

5. The apparatus of claim 4, wherein each of the one or more damage progression models defined, respectively, for the one or more thermal loss parameters depends, in addition to an associated wear parameter, on an associated thermal loss parameter and one or more temperature cycling properties of an associated layer.

6. The apparatus of claim 1, wherein the one or more random processes for defining the values of the one or more wear parameters are random walk processes and the apparatus further comprises means configured to perform, for each of the one or more wear parameters:

adjusting a variance of noise added in a random walk process over time based on a level of convergence of values of a wear parameter so as to enable expedited convergence and efficient tracking.

7. The apparatus of claim 1, wherein the apparatus further comprises means configured to perform:

causing transmitting information on the current estimate of the joint state-parameter space via a communication link or network to at least one computing device for enabling performing of prognosis.

8. The apparatus of claim 1, wherein the apparatus further comprises means configured to perform:

simulating consecutive future estimates of the joint state-parameter space of the computational model using the Bayesian filter starting from the current estimate of the joint state-parameter space until a pre-defined failure threshold for at least one of the one or more thermal loss parameters is reached; and calculating a remaining useful life estimate for the IGBT module based on results of the simulating.

9. The apparatus of claim 1, wherein the one or more thermal loss parameters comprise one or more parameters quantifying thermal loss for one or more joining layers of the IGBT module being associated with loss of contact area of the one or more joining layers due to damage.

10. The apparatus of claim 9, wherein the one or more joining layers of the IGBT module comprise a chip solder layer and/or a system solder layer.

11. The apparatus of claim 1, wherein the one or more temperatures of the IGBT module further comprise one or more layer-specific temperatures each of which relates to a temperature of a layer of the IGBT module or a plurality of adjacent layers of the IGBT module, the apparatus comprises one or more temperature sensors configured to measure temperature associated with a layer or multiple adjacent layers of the IGBT module and the determining of the one or more current values of the one or more temperatures further includes:

measuring one or more current values of the one or more layer-specific temperatures via the one or more temperature sensors.

12. The apparatus of claim 1, wherein the apparatus further comprises means configured to perform:

causing displaying information on the current estimate of the joint state-parameter space to a user via a display.

13. An electric drive configured to drive an electrical machine, the electric drive comprising:

an IGBT module;

one or more temperature sensors configured to measure values of the dissipated power at the semiconductors of the IGBT module and an ambient temperature of the IGBT module; and a computing device having a processor, and a memory storing instructions that, when executed by the processor, cause the computing device to:

maintain, in the memory, information on a computational model for modelling thermal behavior of layers of the IGBT module, wherein the computational model includes a plurality of inputs including at least dissipated power at semiconductors of the IGBT module and the ambient temperature of the IGBT module;

receive measurements of values of the dissipated power at the semiconductors of the IGBT module and the ambient temperature from the one or more temperature sensors;

determine one or more current values of one or more temperatures of the IGBT module, wherein the determining includes at least measuring a current value of a switching delay of the IGBT module and determining a current value of a junction temperature of the IGBT module based on the current value of the switching delay; and calculate a current estimate of a joint state-parameter space defined for the computational model using a Bayesian filter in combination with the computational model taking as inputs at least the measured values of the dissipated power and the ambient temperature, wherein the joint state-parameter space includes at least the one or more temperatures of the IGBT module, one or more thermal loss parameters quantifying thermal loss in one or more layers of the IGBT module and one or more wear parameters quantifying a change in the one or more thermal loss parameters over time due to unknown wear, the one or more wear parameters being defined via one or more random processes, the one or more current values of the one or more temperatures being used as observations in the Bayesian filter.

* * * * *